US012796467B2

(12) United States Patent
Ohashi et al.

(10) Patent No.: US 12,796,467 B2
(45) Date of Patent: Nov. 10, 2026

(54) INSULATED CIRCUIT BOARD WITH INTEGRATED HEAT SINK, AND ELECTRONIC DEVICE

(71) Applicant: MITSUBISHI MATERIALS CORPORATION, Tokyo (JP)

(72) Inventors: Toyo Ohashi, Saitama (JP); Yoshiaki Sakaniwa, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 238 days.

(21) Appl. No.: 18/843,728

(22) PCT Filed: Oct. 20, 2022

(86) PCT No.: PCT/JP2022/039145
§ 371 (c)(1),
(2) Date: Sep. 4, 2024

(87) PCT Pub. No.: WO2023/171019
PCT Pub. Date: Sep. 14, 2023

(65) Prior Publication Data
US 2025/0193993 A1 Jun. 12, 2025

(30) Foreign Application Priority Data
Mar. 11, 2022 (JP) ................................ 2022-037910

(51) Int. Cl.
*H10W 40/25* (2026.01)
*H05K 1/02* (2006.01)
(Continued)

(52) U.S. Cl.
CPC .......... *H10W 40/255* (2026.01); *H05K 7/205* (2013.01); *H05K 1/0204* (2013.01);
(Continued)

(58) Field of Classification Search
CPC ............... H05K 7/20409; H05K 7/205; H05K 7/20509; H05K 1/0204; H05K 1/181;
(Continued)

(56) References Cited

U.S. PATENT DOCUMENTS

2012/0134115 A1* 5/2012 Schulz-Harder .... H10W 40/255 361/720
2012/0298408 A1* 11/2012 Nagatomo .......... H10W 40/258 174/260
(Continued)

FOREIGN PATENT DOCUMENTS

JP H11-204700 A 7/1999
JP 2019-169634 A 10/2019
(Continued)

OTHER PUBLICATIONS

International Search Report mailed Jan. 17, 2023, issued for PCT/JP2022/039145 and English translation thereof.
(Continued)

*Primary Examiner* — Zachary Pape
(74) *Attorney, Agent, or Firm* — Troutman Pepper Locke LLP

(57) ABSTRACT

A heatsink-integrated insulated circuit board includes a heatsink, an insulation layer formed on a top plate part of the heatsink, and a circuit layer formed on a surface of the insulation layer opposite to the heatsink, in which an electronic component is mounted on a mounting surface of the circuit layer. The circuit layer is made of copper or a copper alloy, and when a component occupancy ratio, which is a ratio of an occupied area of the electronic component to an area of the mounting surface of the circuit layer, is defined as X and a ratio $\lambda_R/t_R$ of a thermal conductivity $\lambda_R$ of the insulation layer to a thickness $t_R$ of the insulation layer is defined as Y, in a range in which the component occupancy ratio X is 0.6 or less, a thickness $t_C$ of the circuit layer is set
(Continued)

within a range of $0.7\times(-5X-0.005Y+4.5)\leq t_C\leq 1.3\times(-5X-0.005Y+4.5)$.

4 Claims, 9 Drawing Sheets

(51) Int. Cl.
*H05K 1/181* (2026.01)
*H05K 7/20* (2006.01)
*H10W 40/22* (2026.01)
*H10W 70/60* (2026.01)

(52) U.S. Cl.
CPC .......... *H05K 1/181* (2013.01); *H10W 40/226* (2026.01); *H10W 70/60* (2026.01)

(58) Field of Classification Search
CPC .. H10W 40/226; H10W 40/255; H10W 70/60
See application file for complete search history.

(56) References Cited

U.S. PATENT DOCUMENTS

2017/0352607 A1* 12/2017 Kooriyama .............. H05K 1/02
2021/0020557 A1* 1/2021 Sakaniwa .............. H05K 1/036
2025/0193993 A1* 6/2025 Ohashi ................. H05K 1/0203

FOREIGN PATENT DOCUMENTS

JP 2020136349 A * 8/2020
JP 2020-191411 A 11/2020
JP 2021-145094 A 9/2021

OTHER PUBLICATIONS

Supplementary European Search Report mailed Feb. 4, 2026, issued for EP22930995.0.

* cited by examiner

INSULATED CIRCUIT BOARD WITH INTEGRATED HEAT SINK, AND ELECTRONIC DEVICE

TECHNICAL FIELD

The present invention relates to a heatsink-integrated insulated circuit board including a heatsink, an insulation layer, and a circuit layer, and an electronic device.

Priority is claimed on Japanese Patent Application No. 2022-037910, filed Mar. 11, 2022, the content of which is incorporated herein by reference.

BACKGROUND ART

Various electronic devices such as a power module, an LED module, and a thermoelectric module have a structure in which an electronic component such as a power semiconductor element, an LED element, and a thermoelectric element is bonded to an insulated circuit board in which a circuit layer formed of a conductive material is formed on one surface of an insulation layer. As the insulation layer, an insulation layer made of ceramics or an insulation layer made of an insulating resin has been proposed.

In addition, in these insulated circuit boards, a heatsink is disposed to radiate heat from the mounted elements.

For example, Patent Documents 1 and 2 propose a heatsink-integrated insulated circuit board in which a heatsink and a circuit layer are insulated by an insulating resin layer.

CITATION LIST

Patent Documents

[Patent Document 1]
Japanese Unexamined Patent Application, First Publication No. H11-204700

[Patent Document 2]
Japanese Unexamined Patent Application, First Publication No. 2021-145094

SUMMARY OF INVENTION

Technical Problem

The heatsink-integrated insulated circuit board has a configuration in which heat generated from an electronic component mounted on the circuit layer is spread in a plane direction in the circuit layer, is transferred to the heatsink via an insulation layer, and is radiated by the heatsink.

Here, by increasing a thickness of the circuit layer, the heat from the electronic component is easily spread in the plane direction, but this causes a thermal resistance in a thickness direction. Therefore, in order to efficiently radiate the heat from the mounted electronic component through the heatsink, it is necessary to optimize the thickness of the circuit layer.

The present invention has been made in view of the above-described circumstances, and an objective of the present invention is to provide a heatsink-integrated insulated circuit board and an electronic device, with which it is possible to efficiently radiate heat from a mounted electronic component through a heatsink.

Solution to Problem

In order to solve such a problem and achieve the above-mentioned objective, the inventors have conducted intensive studies and found that, by defining an appropriate thickness of a circuit layer according to an occupied area of an electronic component in the circuit layer, it is possible to efficiently radiate heat generated by the electronic component through a heatsink.

The present invention has been made based on the above-described findings, a heatsink-integrated insulated circuit board according to the present invention includes a heatsink, an insulation layer formed on a top plate part of the heatsink, and a circuit layer formed on a surface of the insulation layer opposite to the heatsink, in which an electronic component is mounted on a mounting surface of the circuit layer, the circuit layer is made of copper or a copper alloy, and a thickness $t_C$ of the circuit layer is set within a range of $0.7\times(-5X-0.005Y+4.5)\leq t_C\leq 1.3\times(-5X-0.005Y+4.5)$ in a range in which a component occupancy ratio X is 0.6 or less, when the component occupancy ratio is defined as X and a ratio $\lambda_R/t_R$ of a thermal conductivity $\lambda_R$ of the insulation layer to a thickness $t_R$ of the insulation layer is defined as Y, the component occupancy ratio being a ratio of an occupied area of the electronic component to an area of the mounting surface of the circuit layer.

With the heatsink-integrated insulated circuit board according to the present invention, the thickness $t_C$ of the circuit layer is set within the range defined by the above-described expression with the component occupancy ratio X, which is the ratio of the occupied area of the mounted electronic component to the area of the mounting surface of the circuit layer, and the ratio $Y=\lambda_R/t_R$ of the thermal conductivity $\lambda_R$ of the insulation layer to the thickness $t_R$ of the insulation layer, so that it is possible to efficiently radiate heat generated by the electronic component through the heatsink.

Here, in the heatsink-integrated insulated circuit board according to the present invention, it is preferable that the thickness $t_R$ of the insulation layer is set within a range of 0.05 mm or more and 0.3 mm or less, and the thermal conductivity $\lambda_R$ of the insulation layer is set within a range of 3 W/(m·K) or more and 30 W/(m·K) or less.

In this case, since the thickness and the thermal conductivity of the insulation layer are set within the above-described ranges, heat on a circuit layer side can be transferred to a heatsink side, and the insulating properties between the circuit layer and the heatsink can be sufficiently secured.

In addition, in the heatsink-integrated insulated circuit board according to the present invention, it is preferable that the heatsink is made of copper or a copper alloy.

In this case, since the heatsink is made of copper or a copper alloy, excellent thermal conductivity is obtained, and the heat generated from the electronic component can be further efficiently radiated.

An electronic device according to the present invention includes the above-described heatsink-integrated insulated circuit board, and the electronic component mounted on the mounting surface of the circuit layer of the heatsink-integrated insulated circuit board.

With the electronic device having this configuration, as described above, since the heatsink-integrated insulated circuit board having excellent heat radiation characteristics is provided, it is possible to efficiently radiate the heat generated from the electronic component, and the electronic device can be stably used even in a case where an amount of the heat generated from the electronic component is increased.

Advantageous Effects of Invention

According to the present invention, it is possible to provide a heatsink-integrated insulated circuit board and an electronic device, with which it is possible to efficiently radiate heat from a mounted electronic component through a heatsink.

DESCRIPTION OF EMBODIMENTS

Figure 1:
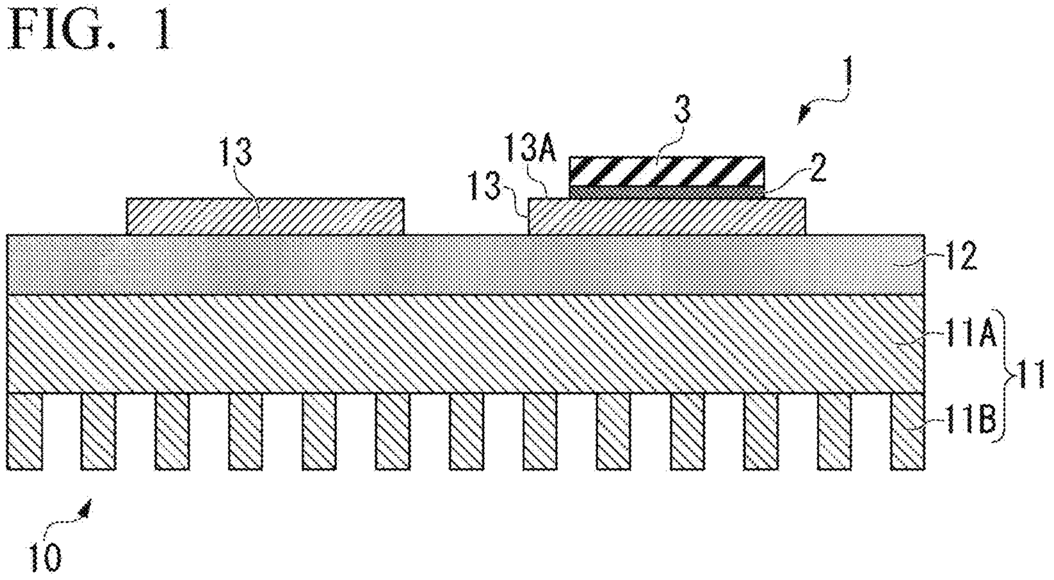
FIG. 1 is a schematic explanatory diagram of a semiconductor device formed of a heatsink-integrated insulated circuit board according to an embodiment of the present invention.

An embodiment of the present invention will be described with reference to the drawings. Each embodiment described below is specifically described for better understanding of the gist of the invention, and does not limit the present invention unless otherwise specified. In addition, in the drawings used in the following description, for convenience, a portion serving as a main part may be enlarged in some cases in order to make the features of the present invention easy to understand, and a dimensional ratio or the like of each component is not always the same as an actual one.

FIG. 1 represents a heatsink-integrated insulated circuit board 10 and a semiconductor device 1 (electronic device) formed of the heatsink-integrated insulated circuit board 10 according the embodiment of the present invention.

The semiconductor device 1 shown in FIG. 1 includes the heatsink-integrated insulated circuit board 10 and an electronic component 3 that is bonded to one surface (upper surface in FIG. 1) of the heatsink-integrated insulated circuit board 10 with a solder layer 2 interposed therebetween. In the present embodiment, the electronic component 3 is a semiconductor element.

The electronic component 3 is made of a semiconductor material such as Si. The solder layer 2 that bonds the heatsink-integrated insulated circuit board 10 and the electronic component 3 to each other is made of, for example, an Sn—Ag-based, Sn—Cu-based, Sn—In-based, or Sn—Ag—Cu-based solder material (so-called a lead-free solder material).

The heatsink-integrated insulated circuit board 10 includes a heatsink 11, an insulation layer 12 formed on one surface (upper surface in FIG. 1) of a top plate part 11A of the heatsink 11, and a circuit layer 13 formed on one surface (upper surface in FIG. 1) of the insulation layer 12.

The electronic component 3 is bonded to a mounting surface 13A (upper surface in FIG. 1) of the circuit layer 13. The heatsink 11 includes the top plate part 11A and a cooling fin 11B that protrudes from the other surface (lower surface in FIG. 1) of the top plate part 11A.

The heatsink 11 is made of a material having excellent thermal conductivity, and is made of, for example, a metal such as copper or a copper alloy, or aluminum or an aluminum alloy, a carbonaceous material, or a composite material of a metal and a carbonaceous material.

In the present embodiment, the heatsink 11 (the top plate part 11A and the cooling fin 11B) is preferably made of copper or a copper alloy.

A thickness of the top plate part 11A is preferably 1 mm or more and more preferably 3 mm or more. On the other hand, the thickness of the top plate part 11A is preferably 7 mm or less and more preferably 5 mm or less.

Furthermore, the cooling fin 11B may have a pin-fin structure or a comb-like structure.

The insulation layer 12 prevents electrical connection between the circuit layer 13 and the heatsink 11, and is made of an insulating resin in the present embodiment.

In the present embodiment, it is preferable to use a resin containing a filler of an inorganic material as a resin constituting the insulation layer 12, in order to secure the strength of the insulation layer 12 and to secure the thermal conductivity. Here, as the filler, for example, alumina, boron nitride, or aluminum nitride can be used. From the viewpoint of securing the thermal conductivity in the insulation layer 12, the content of the filler is preferably 50 mass % or more and more preferably 70 mass % or more.

As a thermosetting resin, an epoxy resin, a polyimide resin, a silicon resin, or the like can be used. Here, when the thermosetting resin is a silicon resin, the above-described filler can be contained in 70 mass % or more, and when the thermosetting resin is an epoxy resin, the above-described filler can be contained in 80 mass % or more. Here, in the present embodiment, a thickness $t_R$ of the insulation layer 12 is preferably within a range of 0.05 mm or more and 0.3 mm or less.

The thickness $t_R$ of the insulation layer 12 is more preferably 0.08 mm or more and still more preferably 0.1 mm or more. On the other hand, the thickness $t_R$ of the insulation layer 12 is more preferably 0.25 mm or less and still more preferably 0.2 mm or less.

In addition, it is preferable that a thermal conductivity $\lambda_R$ of the insulation layer 12 is set within a range of 3 W/(m·K) or more and 30 W/(m·K) or less.

The thermal conductivity $\lambda_R$ of the insulation layer 12 is more preferably 5 W/(m·K) or more and still more preferably 8 W/(m·K) or more. On the other hand, the thermal conductivity $\lambda_R$ of the insulation layer 12 is more preferably 25 W/(m·K) or less and still more preferably 20 W/(m·K) or less.

Figure 11:
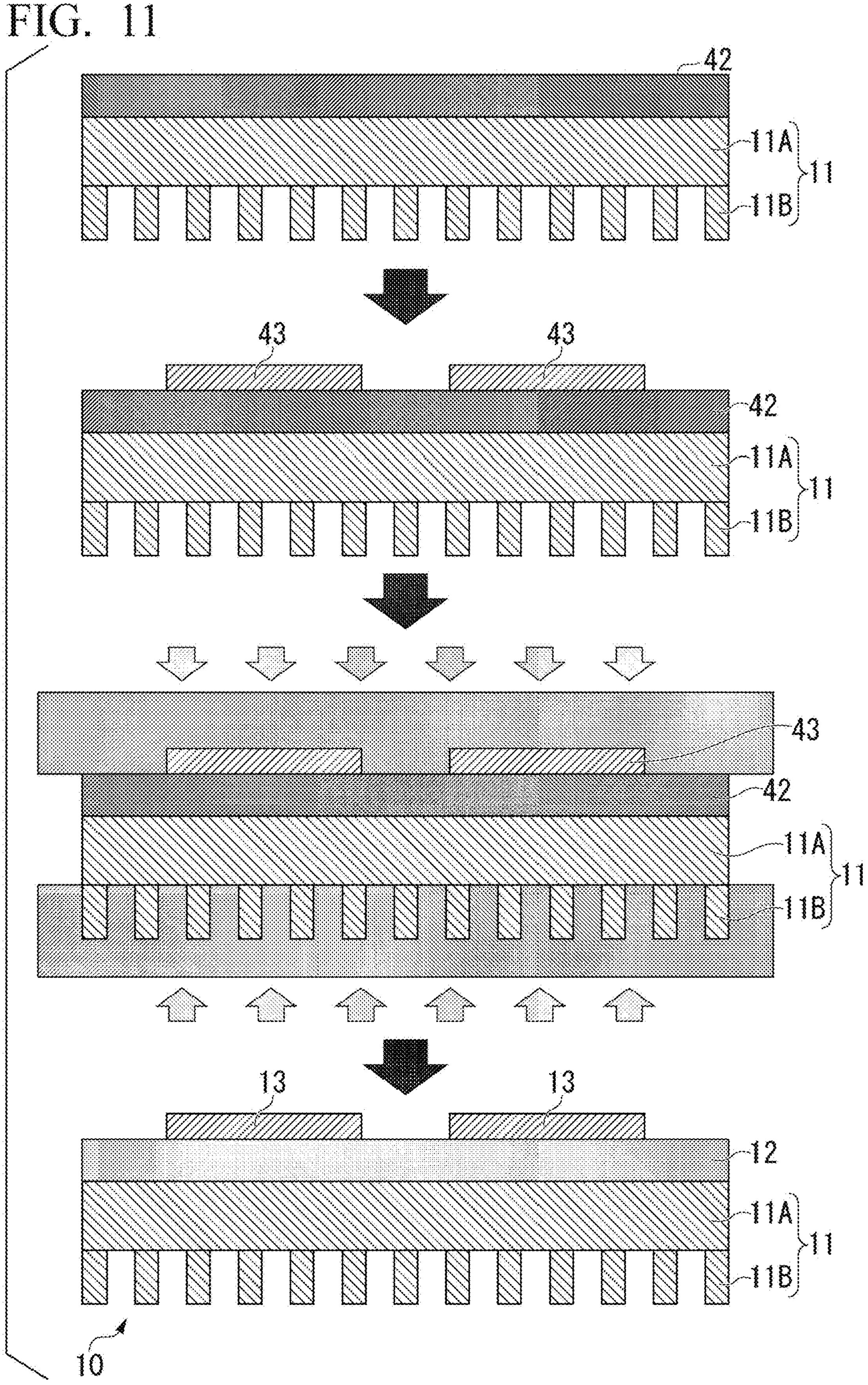
FIG. 11 is an explanatory diagram of the manufacturing method of the heatsink-integrated insulated circuit board according to the embodiment of the present invention.

As shown in FIG. 11, the circuit layer 13 is formed by bonding a metal piece 43 formed of a metal having excellent conductive properties to one surface of the insulation layer 12.

As the metal piece 43, copper or a copper alloy, aluminum or an aluminum alloy, or the like can be used. In the present embodiment, as the metal piece 43 constituting the circuit layer 13, a metal piece obtained by punching out a rolled plate of oxygen-free copper is used.

In the circuit layer 13, a circuit pattern is formed, and one surface (upper surface shown in FIG. 1) thereof is the mounting surface 13A on which the electronic component 3 is mounted.

In the heatsink-integrated insulated circuit board 10 according to the present embodiment, a thickness $t_C$ of the circuit layer 13 is set as follows by the component occupancy ratio X, which is the ratio of the occupied area of the electronic component 3 to the area of the mounting surface of the circuit layer 13, and the ratio $Y=\lambda_R/t_R$ of the thermal conductivity $\lambda_R$ of the insulation layer 12 to the thickness $t_R$ of the insulation layer 12.

$$0.7\times(-5X-0.005Y+4.5)\leq t_C\leq 1.3\times(-5X-0.005Y+4.5)$$

Note that the component occupancy ratio X is 0.6 or less.

The value of $t_C$ is preferably closer to −5X−0.005Y+4.5, and may be in the following range.

$$0.8\times(-5X-0.005Y+4.5)\leq t_C\leq 1.2\times(-5X-0.005Y+4.5)$$

$$0.9\times(-5X-0.005Y+4.5)\leq t_C\leq 1.1\times(-5X-0.005Y+4.5)$$

Hereinafter, the reason why the thickness $t_C$ of the circuit layer 13 is defined as described above will be described.

Heat generated from the electronic component 3 mounted on the mounting surface 13A of the circuit layer 13 is spread in a plane direction in the circuit layer 13 having excellent thermal conductivity, is transferred to the heatsink 11 via the insulation layer 12, and is radiated from the cooling fin 11B of the heatsink 11.

Therefore, in order to efficiently radiate the heat from the electronic component 3, it is necessary to reduce the thermal resistance of the heatsink-integrated insulated circuit board 10 in a thickness direction.

Here, FIGS. 2A, 2B, 3, 4A, 4B, 5, 6A, 6B, 7A, 7B, 8A, 8B, and 8C show results of thermal calculation of the thermal resistance in the thickness direction of the heatsink-integrated insulated circuit board of various structures. FIGS. 3, 5, 7A, 7B, 8A, 8B, and 8C show a relationship between a thickness of the circuit layer of the heatsink-integrated insulated circuit board and a surface temperature of the electronic component mounted on the circuit layer as the thermal calculation results. The lower the surface temperature of the electronic component is, the lower the thermal resistance in the thickness direction of the heatsink-integrated insulated circuit board is, and the more excellent the heat radiation characteristics are.

Figure 2A:
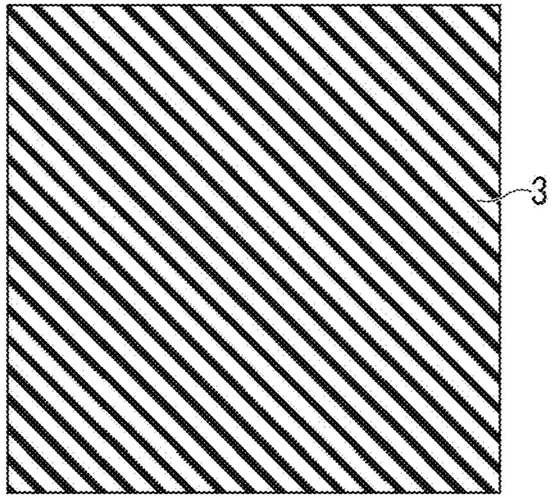
FIG. 2A is a top view of an integrated heatsink-integrated insulated circuit board on which an electronic component is mounted with a component occupancy ratio X=1.0.
Figure 2B:
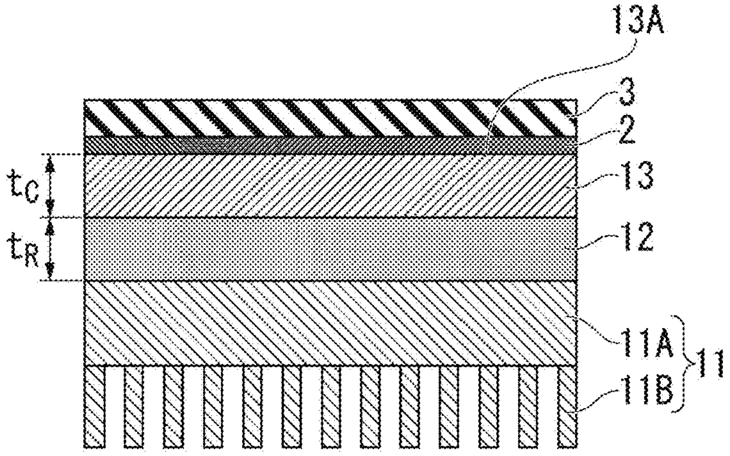
FIG. 2B is a cross-sectional view of the integrated heatsink-integrated insulated circuit board on which the electronic component is mounted with the component occupancy ratio X=1.0.
Figure 3:
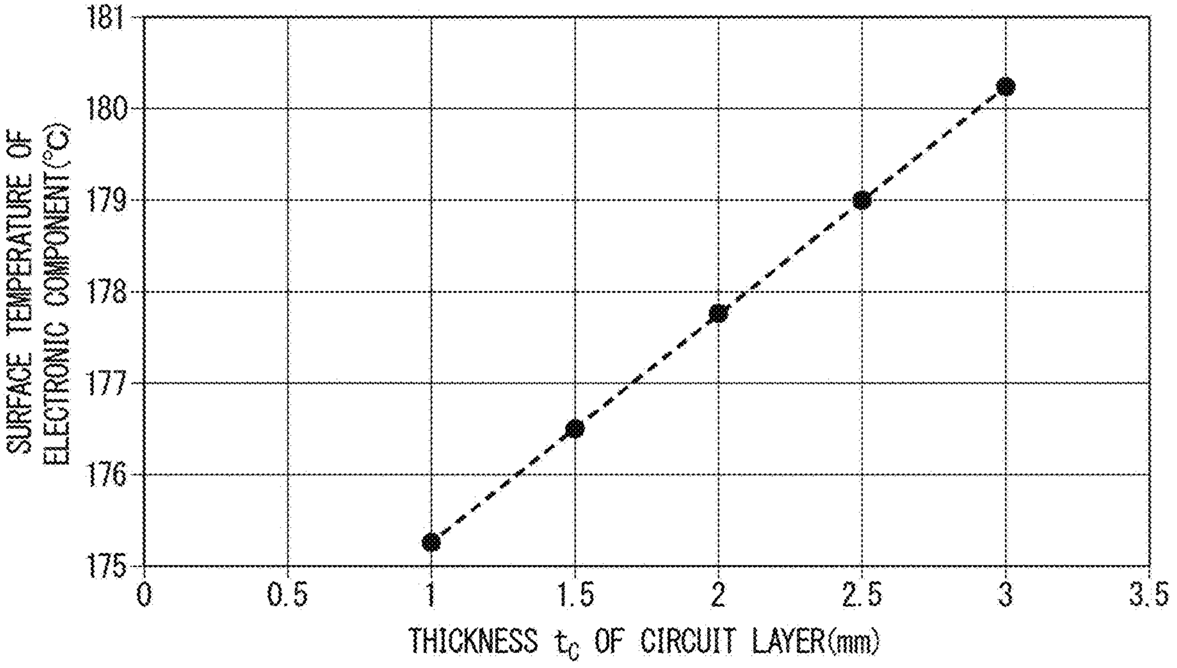
FIG. 3 is a graph showing a relationship between a thickness of a circuit layer and a surface temperature of an electronic component when the electronic component is mounted with the component occupancy ratio X=1.0.

FIGS. 2A, 2B, and 3 show a case in which the component occupancy ratio X, which is the ratio of the occupied area of the electronic component 3 to the area of the mounting surface 13A of the circuit layer 13, is set to 1.0, that is, a case in which the electronic component 3 is mounted on the entire surface of the mounting surface 13A of the circuit layer 13.

It can be seen that, as the thickness $t_C$ of the circuit layer 13 increases, the surface temperature of the electronic component increases, and the thermal resistance in the thickness direction of the heatsink-integrated insulated circuit board increases. Since the component occupancy ratio X is 1.0, in the circuit layer 13, there is no effect of spreading the heat in the plane direction and the heat is transferred only in the thickness direction, and as the thickness $t_C$ of the circuit layer 13 increases, the thermal resistance in the thickness direction of the heatsink-integrated insulated circuit board increases.

Figure 4A:
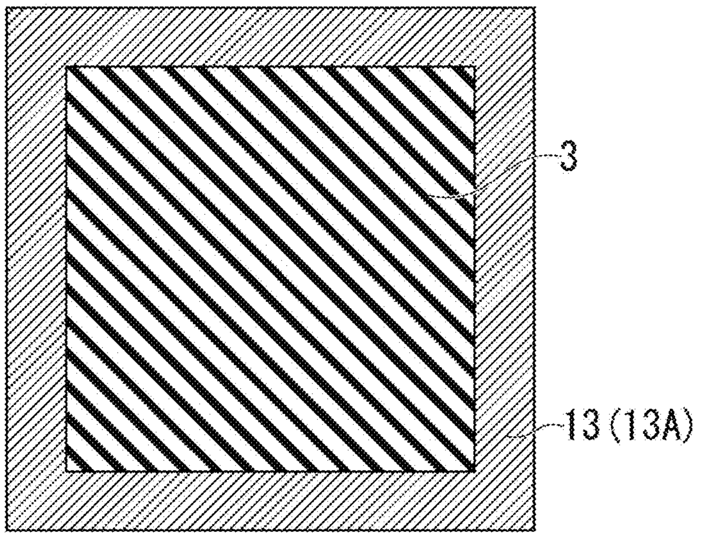
FIG. 4A is a top view of the integrated heatsink-integrated insulated circuit board on which the electronic component is mounted with the component occupancy ratio X=0.59.
Figure 4B:
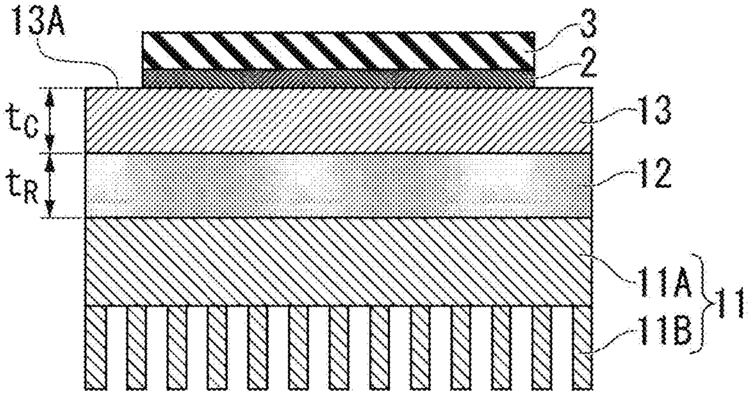
FIG. 4B is a cross-sectional view of the integrated heatsink-integrated insulated circuit board on which the electronic component is mounted with the component occupancy ratio X=0.59.
Figure 5:
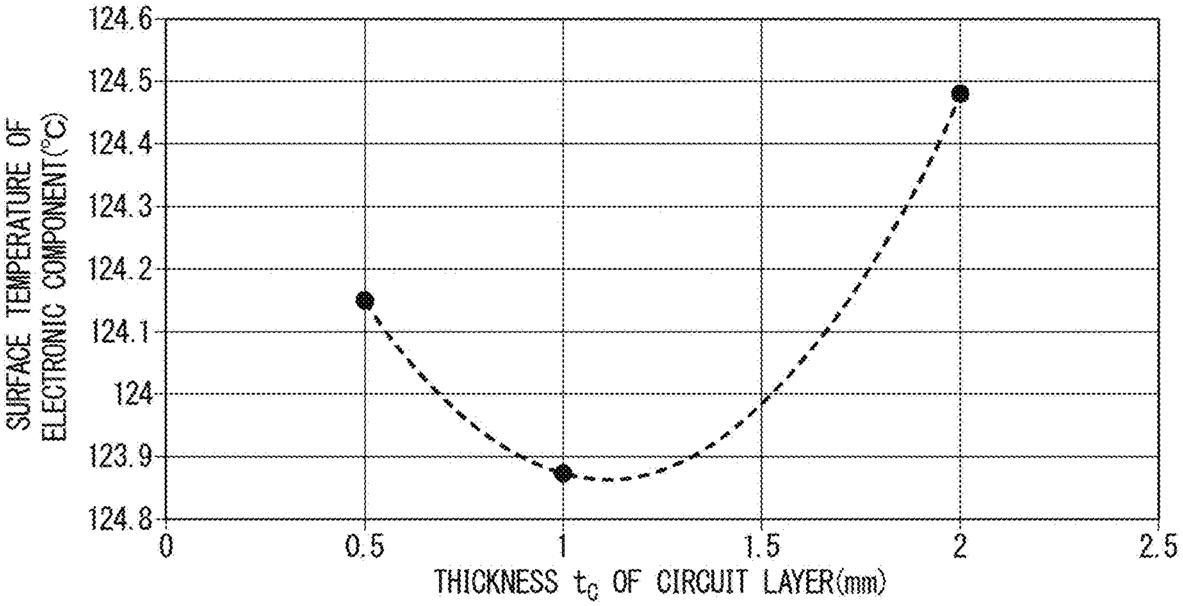
FIG. 5 is a graph showing a relationship between a thickness of the circuit layer and a surface temperature of the electronic component when the electronic component is mounted with the component occupancy ratio X=0.59.
Figure 6A:
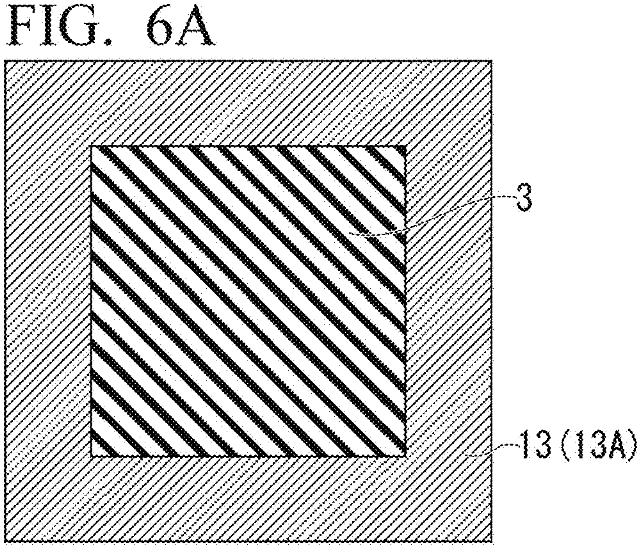
FIG. 6A is a top view of the integrated heatsink-integrated insulated circuit board on which the electronic component is mounted with the component occupancy ratio X=0.44.
Figure 6B:
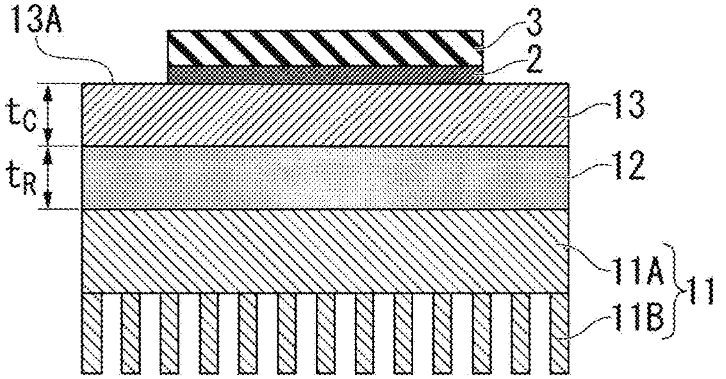
FIG. 6B is a cross-sectional view of the integrated heatsink-integrated insulated circuit board on which the electronic component is mounted with the component occupancy ratio X=0.44.

FIGS. 4A, 4B, and 5 show a case in which the component occupancy ratio X, which is the ratio of the occupied area of the electronic component 3 to the area of the mounting surface 13A of the circuit layer 13, is 0.59.

It can be seen that the surface temperature of the electronic component has a local minimum with respect to the thickness $t_C$ of the circuit layer 13.

The lower the surface temperature of the electronic component is, the smaller the thermal resistance of the heatsink-integrated insulated circuit board is. Since the component occupancy ratio X is 0.59, in the circuit layer 13, the heat is spread in the plane direction and is transferred in the thickness direction. Therefore, by optimizing the thickness $t_C$ of the circuit layer 13 in consideration of the effect of spreading the heat in the plane direction and the thermal resistance in the thickness direction, it is possible to reduce the thermal resistance in the thickness direction of the heatsink-integrated insulated circuit board.

Figure 7A:
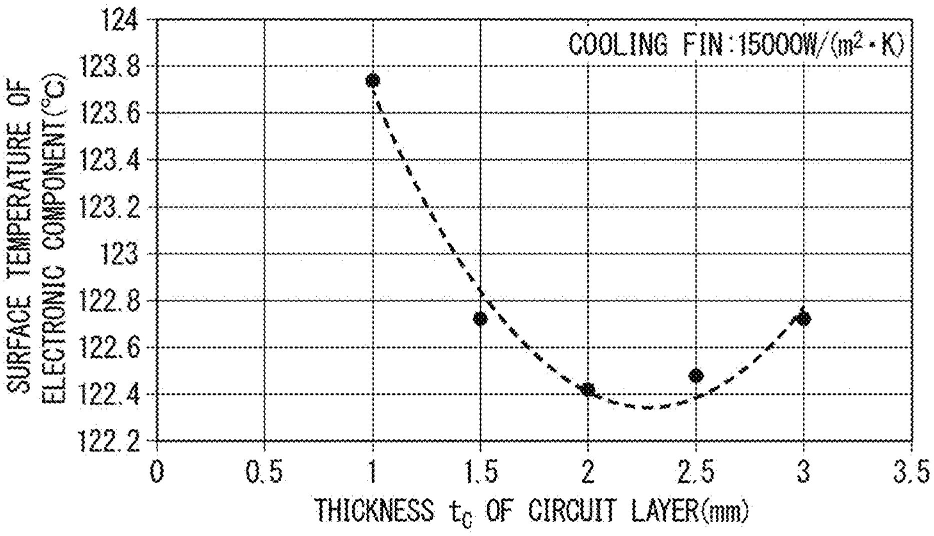
FIG. 7A is a graph showing a relationship between a thickness of the circuit layer and a surface temperature of the electronic component when the electronic component is mounted with the component occupancy ratio X=0.44 (a case where a heat transfer coefficient of a heatsink is 15000 $W/(m^2 \cdot K)$).
Figure 7B:
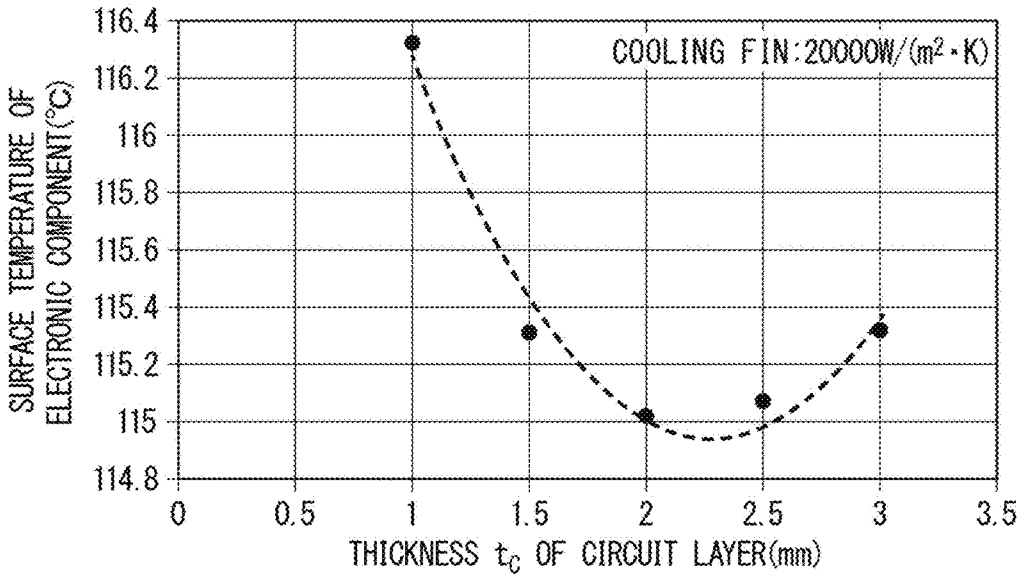
FIG. 7B is a graph showing a relationship between a thickness of the circuit layer and a surface temperature of the electronic component when the electronic component is mounted with the component occupancy ratio X=0.44 (a case where the heat transfer coefficient of the heatsink is 20000 $W/(m^2 \cdot K)$).
Figure 8A:
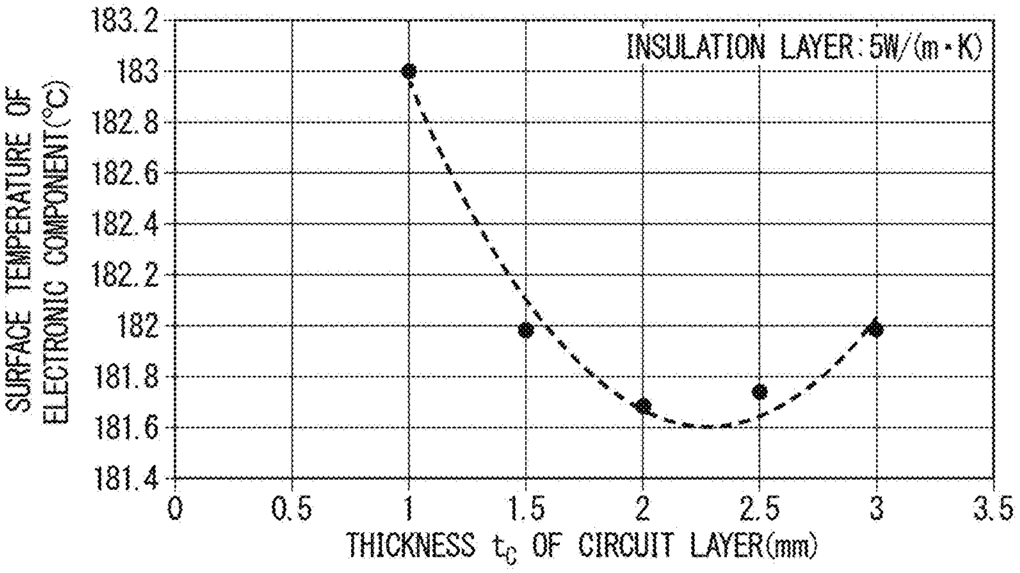
FIG. 8A is a graph showing a relationship between a thickness of the circuit layer and a surface temperature of the electronic component when the electronic component is mounted with the component occupancy ratio X=0.44 (a case where a thermal conductivity of an insulation layer is 5 W/(m·K)).
Figure 8B:
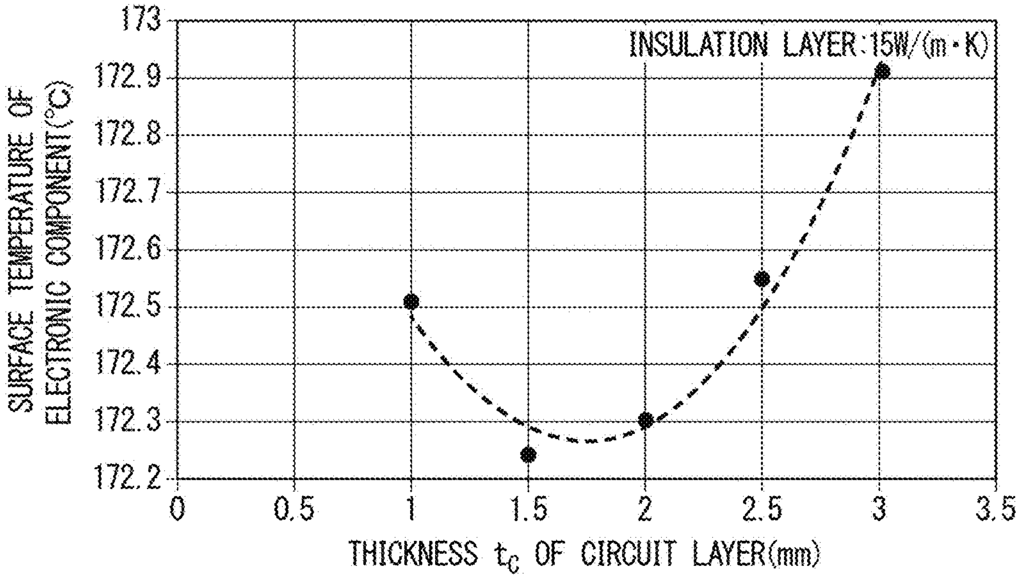
FIG. 8B is a graph showing a relationship between a thickness of the circuit layer and a surface temperature of the electronic component when the electronic component is mounted with the component occupancy ratio X=0.44 (a case where the thermal conductivity of the insulation layer is 15 W/(m·K)).
Figure 8C:
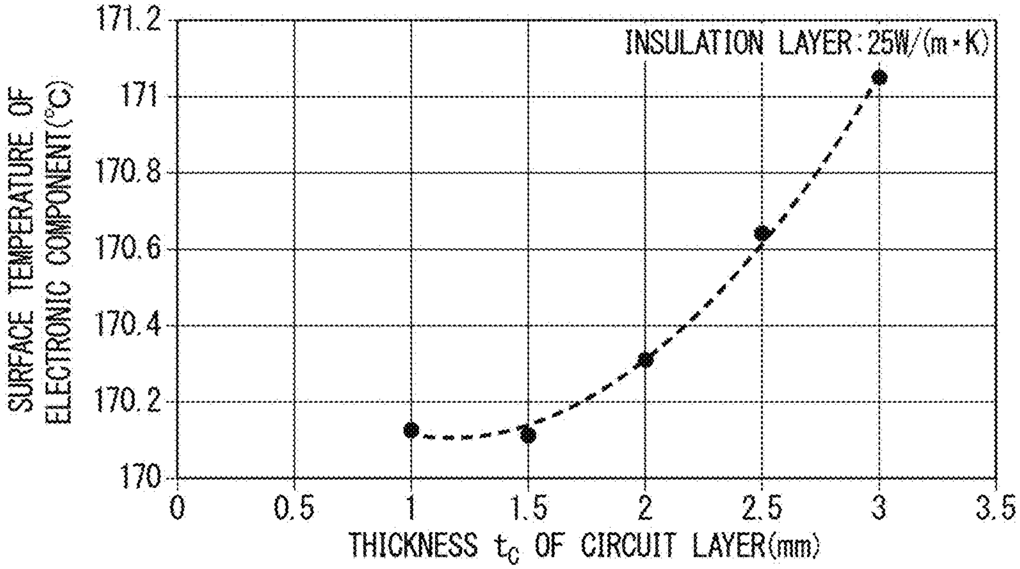
FIG. 8C is a graph showing a relationship between a thickness of the circuit layer and a surface temperature of the electronic component when the electronic component is mounted with the component occupancy ratio X=0.44 (a case where the thermal conductivity of the insulation layer is 25 W/(m·K)).

FIGS. 6A, 6B, 7A, 7B, 8A, 8B, and 8C show a case in which the component occupancy ratio X, which is the ratio of the occupied area of the electronic component 3 to the area of the mounting surface 13A of the circuit layer 13, is 0.44. Here, in FIGS. 7A and 7B, a heat transfer coefficient of the heatsink 11 was changed to execute the thermal calculation. In FIGS. 8A, 8B, and 8C, the thermal conductivity $\lambda_R$ of the insulation layer 12 was changed to execute the thermal calculation.

It can be seen that the surface temperature of the electronic component has a local minimum with respect to the thickness $t_C$ of the circuit layer 13.

The lower the surface temperature of the electronic component is, the smaller the thermal resistance of the heatsink-integrated insulated circuit board is.

As shown in FIGS. 7A and 7B, even in a case where the heat transfer coefficient of the cooling fin 11B was changed, the thickness $t_C$ of the circuit layer 13 in which the surface temperature (thermal resistance of the heatsink-integrated insulated circuit board) of the electronic component showed the local minimum did not change.

In addition, as shown in FIGS. 8A, 8B, and 8C, it was found that, in a case where the thermal conductivity $\lambda_R$ of the insulation layer 12 was changed, the thickness $t_C$ of the circuit layer 13 in which the surface temperature (thermal resistance of the heatsink-integrated insulated circuit board) of the electronic component showed the local minimum changed. This is presumed to be because it is necessary to sufficiently spread the heat in the plane direction in the circuit layer 13 in a case where the thermal resistance in the insulation layer 12 is large.

From the above thermal calculation results, in order to reduce the thermal resistance of the heatsink-integrated insulated circuit board in order to improve the heat radiation, it is necessary to optimize the thickness $t_C$ of the circuit layer 13, since the heat is sufficiently spread in the plane direction in the circuit layer 13 and is transferred in the thickness direction.

It was found that the proper value of the thickness of the circuit layer 13 was not greatly affected by the heat radiation characteristics of the heatsink, but was affected by the thermal resistance in the insulation layer 12.

Therefore, in the heatsink-integrated insulated circuit board 10 according to the present embodiment, as described above, the thickness $t_C$ of the circuit layer 13 is defined by the component occupancy ratio X and the ratio $Y=\lambda_R/t_R$ of the thermal conductivity $\lambda_R$ of the insulation layer 12 to the thickness $t_R$ of the insulation layer 12.

As described above, depending on the thickness $t_C$ of the circuit layer 13, the thermal resistance in the thickness direction of the heatsink-integrated insulated circuit board exhibits a clear local minimum in a case where the component occupancy ratio X is 0.6 or less.

Figure 9:
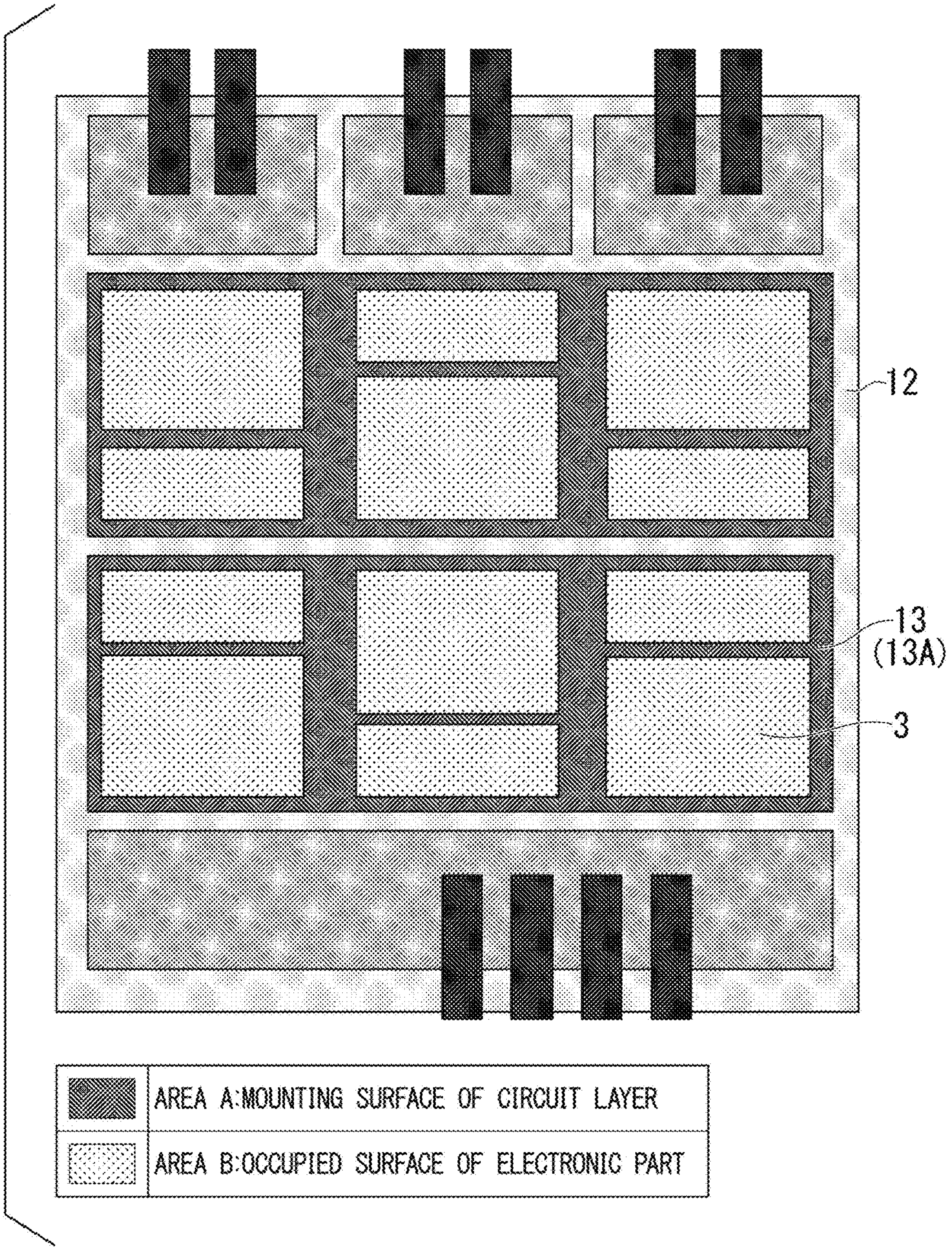
FIG. 9 is an explanatory diagram of a component occupancy ratio in the heatsink-integrated insulated circuit board according to the embodiment of the present invention.

Here, in an actual semiconductor device 1, as shown in FIG. 9, the electronic components 3 are mounted on the circuit layer 13 disposed in a circuit pattern.

In the semiconductor device 1 shown in FIG. 9, the component occupancy ratio X is calculated as X=B/A from the area (total area of an area A in FIG. 9) of the mounting surface 13A of the circuit layer 13 and the occupied area (total area of an area B in FIG. 9) of the electronic component 3.

The area of the circuit layer 13 on which the electronic component 3 is not mounted is not included in the area A. In addition, in the present embodiment, the entire bottom surface of the electronic component 3 is bonded to the circuit layer 13.

Figure 10:
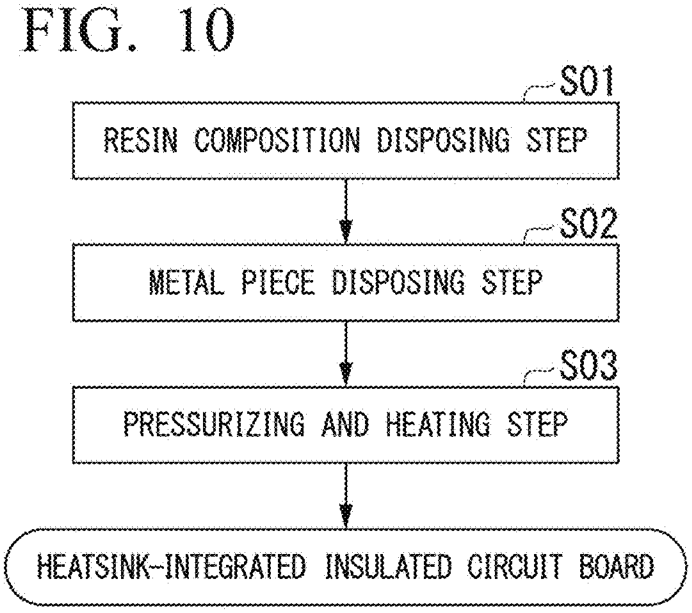
FIG. 10 is a flowchart of a manufacturing method of the heatsink-integrated insulated circuit board according to the embodiment of the present invention.

Next, a manufacturing method of the heatsink-integrated insulated circuit board 10 according to the present embodiment will be described with reference to FIGS. 10 and 11.

(Resin Composition Disposing Step S01)

As shown in FIG. 11, a resin composition 42 containing a filler of an inorganic material, a resin, and a curing agent is disposed on one surface (upper surface in FIG. 11) of the top plate part 11A of the heatsink 11. In the present embodiment, the resin composition 42 is in a form of a sheet.

(Metal Piece Disposing Step S02)

Then, a plurality of metal pieces 43 serving as the circuit layer 13 are disposed in a circuit pattern on one surface (upper surface in FIG. 11) of the resin composition 42.

(Pressurizing and Heating Step S03)

Next, the heatsink 11, the resin composition 42, and the metal pieces 43 are pressurized and heated in a stacking direction by a pressurizing device to cure the resin composition 42 to form the insulation layer 12. In addition, the top plate part 11A of the heatsink 11 and the insulation layer 12 are bonded to each other, and the insulation layer 12 and the metal pieces 43 are bonded to each other.

In the pressurizing and heating step S03, it is preferable that a heating temperature is set within a range of 120° C. or higher and 350° C. or lower, and a retention time at the heating temperature is set within a range of 10 minutes or longer and 180 minutes or shorter. In addition, it is preferable that a pressurizing load in the stacking direction is set within a range of 1 MPa or more and 30 MPa or less.

Here, a lower limit of the heating temperature is more preferably set to 150° C. or higher and still more preferably 170° C. or higher. On the other hand, an upper limit of the heating temperature is more preferably set to 320° C. or lower and still more preferably 300° C. or lower.

A lower limit of the retention time at the heating temperature is more preferably set to 30 minutes or longer and still more preferably set to 60 minutes or longer. On the other hand, an upper limit of the retention time at the heating temperature is more preferably set to 120 minutes or shorter and still more preferably set to 90 minutes or shorter.

A lower limit of the pressurizing load in the stacking direction is more preferably set to 3 MPa or more and still more preferably set to 5 MPa or more. On the other hand, an upper limit of the pressurizing load in the stacking direction is more preferably set to 15 MPa or less and still more preferably set to 10 MPa or less.

With each step described above, the heatsink-integrated insulated circuit board 10 according to the present embodiment is manufactured.

With the heatsink-integrated insulated circuit board 10 according to the present embodiment having the above-described configuration, the thickness $t_C$ of the circuit layer 13 is defined within the following range defined by the component occupancy ratio X, which is the ratio of the occupied area of the electronic component 3 to the area of the mounting surface 13A of the circuit layer 13, and the ratio $Y=\lambda_R/t_R$ of the thermal conductivity $\lambda_R$ of the insulation layer 12 to the thickness $t_R$ of the insulation layer 12, so that the thermal resistance in the thickness direction of the heatsink-integrated insulated circuit board 10 is reduced, and the heat generated by the electronic component 3 can be efficiently radiated from the heatsink 11.

$$0.7\times(-5X-0.005Y+4.5)\leq t_C\leq 1.3\times(-5X-0.005Y+4.5)$$

Note that the component occupancy ratio X is 0.6 or less.

In addition, in the heatsink-integrated insulated circuit board 10 according to the present embodiment, in a case where the thickness $t_R$ of the insulation layer 12 is set within a range of 0.05 mm or more and 0.3 mm or less, and the thermal conductivity $\lambda_R$ of the insulation layer 12 is set within a range of 3 W/(m·K) or more and 30 W/(m·K) or less, the heat from the electronic component 3 can be sufficiently transferred to the heatsink 11 side, and the insulating properties between the circuit layer 13 and the heatsink 11 can be sufficiently secured.

In addition, in the heatsink-integrated insulated circuit board 10 according to the present embodiment, in a case where the heatsink 11 is made of copper or a copper alloy, the heatsink 11 has sufficient thermal conductivity, and the heat generated from the electronic component 3 can be further efficiently radiated.

Furthermore with the semiconductor device 1 (electronic device) according to the present embodiment, since the heatsink-integrated insulated circuit board 10 according to the present embodiment having excellent heat radiation characteristics is provided, it is possible to efficiently radiate the heat generated from the electronic component 3, and the semiconductor device 1 (electronic device) can be stably used even in a case where an amount of the heat generated from the electronic component 3 is increased.

The embodiment of the present invention has been described, but the present invention is not limited thereto, and can be appropriately changed without departing from the technical ideas of the present invention.

For example, in the present embodiment, the heatsink is not particularly limited in structure, and may have a cooling fin of various structures, or may have a stacked structure in the top plate part.

In addition, in the present embodiment, the semiconductor element is mounted as the electronic component, but the present invention is not limited to this, and other electronic components may be used.

EXAMPLES

Confirmatory experiments performed to confirm the effectiveness of the present invention will be described.

First, as shown in Tables 1 to 7, the thermal calculated of the thermal resistance in the thickness direction of the heatsink-integrated insulated circuit board was performed by changing the component occupancy ratio X, the thermal conductivity $\lambda_R$ and the thickness $t_R$ of the insulation layer, and the thickness $t_C$ of the circuit layer.

In Tables 1 to 7, the thermal resistance when the thickness of the circuit layer was used as a parameter was relatively evaluated using the thermal resistance when the thickness of the circuit layer was 0.05 mm as a reference (1.0).

For the thermal calculation, ANSYS (manufactured by ANSYS, Inc.), which is a general-purpose finite element method calculation software, was used. As a calculation model, a stacked structure of an electronic component, a solder layer, a circuit layer, an insulation layer, and a heatsink (only a top plate part) was assumed.

Calculation conditions were assumed to be that heat was generated only from the electronic component, the periphery thereof was insulated, and the heat was radiated only from a lower part of the heatsink. That is, the heat generation amount was set for the electronic component, and the heat transfer coefficient was set only for the lower part of the heatsink. As specific values of the heat generation amount, the physical property, and the heat transfer coefficient, the heat generation amount of the electronic component was set to 100 W, the thermal conductivity of the electronic component was set to 150 to 200 W/(m·K), the thermal conductivity of the solder layer was set to 30 to 50 W/(m·K), the thermal conductivity of the circuit layer was set to 400 W/(m·K), the thermal conductivity of the insulation layer was set to 3 to 30 W/mK, the thermal conductivity of the heatsink (top plate part) was set to 400 W/(m·K), and the heat transfer coefficient of the lower part of the heatsink was set to 5000 to 20000 W/($m^2$·K). The size of the circuit layer was set such that the component occupancy ratio X was 0.2 to 1.0, with the size of the electronic component in plan view being 10 mm×10 mm. The sizes of the solder layer, the circuit layer, the insulation layer, and the heatsink are the same in the plan view, and the electronic component was disposed at the center of the solder layer.

In addition, a state after a sufficient amount of time had elapsed after the heating was assumed, and the temperature of each component was calculated by steady-state heat calculation.

TABLE 1

| | | | Insulation layer | | | | Circuit | |
|---|---|---|---|---|---|---|---|---|
| | | Component occupancy ratio (X) | Thermal conductivity $\lambda_R$ W/(m · K) | Thickness $t_R$ (mm) | $\lambda_R/t_R$ (Y) | Expression ※1 | layer Thickness $t_c$ (mm) | Relative thermal resistance value |
| Comparative Example | 1 | 0.45 | 15 | 0.15 | 100 | 1.75 | 0.05 | 1.00 |
| Comparative Example | 2 | 0.45 | 15 | 0.15 | 100 | 1.75 | 0.50 | 0.94 |
| Comparative Example | 3 | 0.45 | 15 | 0.15 | 100 | 1.75 | 1.00 | 0.90 |
| Present Invention Example | 1 | 0.45 | 15 | 0.15 | 100 | 1.75 | 1.25 | 0.89 |
| Present Invention Example | 2 | 0.45 | 15 | 0.15 | 100 | 1.75 | 1.75 | 0.88 |

TABLE 1-continued

| | | Insulation layer | | | | | Circuit | |
|---|---|---|---|---|---|---|---|---|
| | | Component occupancy ratio (X) | Thermal conductivity $\lambda_R$ W/(m · K) | Thickness $t_R$ (mm) | $\lambda_R/t_R$ (Y) | Expression ※1 | layer Thickness $t_c$ (mm) | Relative thermal resistance value |
| Present Invention Example | 3 | 0.45 | 15 | 0.15 | 100 | 1.75 | 2.20 | 0.89 |
| Comparative Example | 4 | 0.45 | 15 | 0.15 | 100 | 1.75 | 3.00 | 0.91 |

※1 −5X − 0.005Y + 4.5

TABLE 2

| | | Insulation layer | | | | | Circuit | |
|---|---|---|---|---|---|---|---|---|
| | | Component occupancy ratio (X) | Thermal conductivity $\lambda_R$ W/(m · K) | Thickness $t_R$ (mm) | $\lambda_R/t_R$ (Y) | Expression※1 | layer Thickness $t_c$ (mm) | Relative thermal resistance value |
| Comparative Example | 11 | 0.60 | 15 | 0.15 | 100 | 1 | 0.05 | 1.00 |
| Comparative Example | 12 | 0.60 | 15 | 0.15 | 100 | 1 | 0.50 | 0.98 |
| Comparative Example | 13 | 0.60 | 15 | 0.15 | 100 | 1 | 0.70 | 0.96 |
| Present Invention Example | 11 | 0.60 | 15 | 0.15 | 100 | 1 | 1.00 | 0.95 |
| Present Invention Example | 12 | 0.60 | 15 | 0.15 | 100 | 1 | 1.30 | 0.96 |
| Present Invention Example | 13 | 0.60 | 15 | 0.15 | 100 | 1 | 1.50 | 0.97 |
| Comparative Example | 14 | 0.60 | 15 | 0.15 | 100 | 1 | 2.00 | 1.00 |

※1−5X − 0.005Y + 4.5

TABLE 3

| | | Insulation layer | | | | | Circuit | |
|---|---|---|---|---|---|---|---|---|
| | | Component occupancy ratio (X) | Thermal conductivity $\lambda_R$ W/(m · K) | Thickness $t_R$ (mm) | $\lambda_R/t_R$ (Y) | Expression※1 | layer Thickness $t_c$ (mm) | Relative thermal resistance value |
| Comparative Example | 21 | 0.20 | 15 | 0.15 | 100 | 3 | 0.05 | 1.00 |
| Comparative Example | 22 | 0.20 | 15 | 0.15 | 100 | 3 | 0.50 | 0.94 |
| Comparative Example | 23 | 0.20 | 15 | 0.15 | 100 | 3 | 1.00 | 0.89 |
| Present Invention Example | 21 | 0.20 | 15 | 0.15 | 100 | 3 | 2.10 | 0.83 |
| Present Invention Example | 22 | 0.20 | 15 | 0.15 | 100 | 3 | 3.00 | 0.81 |
| Present Invention Example | 23 | 0.20 | 15 | 0.15 | 100 | 3 | 3.90 | 0.85 |
| Comparative Example | 24 | 0.20 | 15 | 0.15 | 100 | 3 | 4.20 | 0.89 |

※1−5X − 0.005Y + 4.5

TABLE 4

| | | | Insulation layer | | | | Circuit | |
|---|---|---|---|---|---|---|---|---|
| | | Component occupancy ratio (X) | Thermal conductivity $\lambda_R$ W/(m · K) | Thickness $t_R$ (mm) | $\lambda_R/t_R$ (Y) | Expression※1 | layer Thickness $t_c$ (mm) | Relative thermal resistance value |
| Comparative Example | 31 | 0.45 | 3 | 0.15 | 20 | 2.15 | 0.05 | 1.00 |
| Comparative Example | 32 | 0.45 | 3 | 0.15 | 20 | 2.15 | 0.50 | 0.84 |
| Comparative Example | 33 | 0.45 | 3 | 0.15 | 20 | 2.15 | 1.00 | 0.70 |
| Present Invention Example | 31 | 0.45 | 3 | 0.15 | 20 | 2.15 | 1.60 | 0.58 |
| Present Invention Example | 32 | 0.45 | 3 | 0.15 | 20 | 2.15 | 2.15 | 0.53 |
| Present Invention Example | 33 | 0.45 | 3 | 0.15 | 20 | 2.15 | 2.70 | 0.55 |
| Comparative Example | 34 | 0.45 | 3 | 0.15 | 20 | 2.15 | 3.20 | 0.61 |

※1 $-5X - 0.005Y + 4.5$

TABLE 5

| | | | Insulation layer | | | | Circuit | |
|---|---|---|---|---|---|---|---|---|
| | | Component occupancy ratio (X) | Thermal conductivity $\lambda_R$ W/(m · K) | Thickness $t_R$ (mm) | $\lambda_R/t_R$ (Y) | Expression※1 | layer Thickness $t_c$ (mm) | Relative thermal resistance value |
| Comparative Example | 41 | 0.45 | 30 | 0.15 | 200 | 1.25 | 0.05 | 1.00 |
| Comparative Example | 42 | 0.45 | 30 | 0.15 | 200 | 1.25 | 0.50 | 0.91 |
| Present Invention Example | 41 | 0.45 | 30 | 0.15 | 200 | 1.25 | 0.90 | 0.82 |
| Present Invention Example | 42 | 0.45 | 30 | 0.15 | 200 | 1.25 | 1.25 | 0.79 |
| Present Invention Example | 43 | 0.45 | 30 | 0.15 | 200 | 1.25 | 1.60 | 0.81 |
| Comparative Example | 43 | 0.45 | 30 | 0.15 | 200 | 1.25 | 2.00 | 0.85 |

※1 $-5X - 0.005Y + 4.5$

TABLE 6

| | | | Insulation layer | | | | Circuit | |
|---|---|---|---|---|---|---|---|---|
| | | Component occupancy ratio (X) | Thermal conductivity $\lambda_R$ W/(m · K) | Thickness $t_R$ (mm) | $\lambda_R/t_R$ (Y) | Expression※1 | layer Thickness $t_c$ (mm) | Relative thermal resistance value |
| Comparative Example | 51 | 0.45 | 15 | 0.05 | 300 | 0.75 | 0.05 | 1.00 |
| Comparative Example | 52 | 0.45 | 15 | 0.05 | 300 | 0.75 | 0.40 | 0.93 |
| Present Invention Example | 51 | 0.45 | 15 | 0.05 | 300 | 0.75 | 0.60 | 0.91 |
| Present Invention Example | 52 | 0.45 | 15 | 0.05 | 300 | 0.75 | 0.75 | 0.90 |

TABLE 6-continued

| | | Component occupancy ratio (X) | Insulation layer: Thermal conductivity $\lambda_R$ W/(m · K) | Insulation layer: Thickness $t_R$ (mm) | $\lambda_R/t_R$ (Y) | Expression※1 | Circuit layer Thickness $t_c$ (mm) | Relative thermal resistance value |
|---|---|---|---|---|---|---|---|---|
| Present Invention Example | 53 | 0.45 | 15 | 0.05 | 300 | 0.75 | 0.90 | 0.91 |
| Comparative Example | 53 | 0.45 | 15 | 0.05 | 300 | 0.75 | 1.20 | 0.93 |

※1 $-5X - 0.005Y + 4.5$

TABLE 7

| | | Component occupancy ratio (X) | Insulation layer: Thermal conductivity $\lambda_R$ W/(m · K) | Insulation layer: Thickness $t_R$ (mm) | $\lambda_R/t_R$ (Y) | Expression※1 | Circuit layer Thickness $t_c$ (mm) | Relative thermal resistance value |
|---|---|---|---|---|---|---|---|---|
| Comparative Example | 61 | 0.45 | 15 | 0.3 | 50 | 2 | 0.05 | 1.00 |
| Comparative Example | 62 | 0.45 | 15 | 0.3 | 50 | 2 | 0.50 | 0.98 |
| Comparative Example | 63 | 0.45 | 15 | 0.3 | 50 | 2 | 1.00 | 0.97 |
| Present Invention Example | 61 | 0.45 | 15 | 0.3 | 50 | 2 | 1.40 | 0.81 |
| Present Invention Example | 62 | 0.45 | 15 | 0.3 | 50 | 2 | 2.00 | 0.76 |
| Present Invention Example | 63 | 0.45 | 15 | 0.3 | 50 | 2 | 2.60 | 0.80 |
| Comparative Example | 64 | 0.45 | 15 | 0.3 | 50 | 2 | 3.00 | 0.82 |

※1 $-5X - 0.005Y + 4.5$

As shown in Tables 1 to 7, it was confirmed that the present invention examples in which the thickness the of the circuit layer was set to be within the following range defined by the component occupancy ratio X and the ratio $Y=\lambda_R/t_R$ of the thermal conductivity $\lambda_R$ of the insulation layer to the thickness $t_R$ of the insulation layer has lower thermal resistance than comparative examples out of the range.

$$0.7\times(-5X-0.005Y+4.5)\leq t_C\leq 1.3\times(-5X-0.005Y+4.5)$$

From results of the above confirmatory experiments, according to the present invention examples, it was confirmed that it is possible to provide a heatsink-integrated insulated circuit board and an electronic device, with which it is possible to efficiently radiate heat from a mounted electronic component through a heatsink.

INDUSTRIAL APPLICABILITY

According to the present invention, it is possible to provide various electronic devices such as a power module, an LED module, and a thermoelectric module, which have excellent heat radiation efficiency and with which it is possible to efficiently radiate heat from a mounted electronic component through a heatsink. Therefore, the present invention is industrially applicable.

REFERENCE SIGNS LIST

1: Semiconductor device (electronic device)
3: Electronic component
10: Heatsink-integrated insulated circuit board
11: Heatsink
11A: Top plate part
12: Insulation layer
13: Circuit layer
13A: Mounting surface

What is claimed is:

1. A heatsink-integrated insulated circuit board comprising:

a heatsink;

an insulation layer formed on a top plate part of the heatsink; and a circuit layer formed on a surface of the insulation layer opposite to the heatsink, wherein an electronic component is mounted on a mounting surface of the circuit layer, the circuit layer is made of copper or a copper alloy, and a thickness $t_C$ of the circuit layer is set within a range of $0.7\times(-5X-0.005Y+4.5)\leq t_C\leq 1.3\times(-5X-0.005Y+4.5)$ in a range in which a component occupancy ratio X is 0.6 or less, when the component occupancy ratio is defined as X and a ratio $\lambda_R/t_R$ of a thermal conductivity $\lambda_R$ of the insulation layer to a thickness $t_R$ of the insulation layer is defined as Y, the component occupancy ratio being a ratio of an occupied area of the electronic component to an area of the mounting surface of the circuit layer.

2. The heatsink-integrated insulated circuit board according to claim 1, wherein the thickness $t_R$ of the insulation layer is set within a range of 0.05 mm or more and 0.3 mm or less, and the thermal conductivity $\lambda_R$ of the insulation layer is set within a range of 3 W/(m·K) or more and 30 W/(m·K) or less.

3. The heatsink-integrated insulated circuit board according to claim 1, wherein the heatsink is made of copper or a copper alloy.

4. An electronic device comprising:

the heatsink-integrated insulated circuit board according to claim 1; and the electronic component mounted on the mounting surface of the circuit layer of the heatsink-integrated insulated circuit board.

* * * * *